(12) United States Patent
Choe

(10) Patent No.: US 10,062,449 B2
(45) Date of Patent: Aug. 28, 2018

(54) MAGNETIC DOMAIN WALL MOTION DEVICE BASED ON MODULATION OF SPIN-ORBIT TORQUE

(71) Applicant: SEOUL NATIONAL UNIVERSITY R&DB FOUNDATION, Gwanak-gu (KR)

(72) Inventor: Sug Bong Choe, Seocho-gu (KR)

(73) Assignee: SEOUL NATIONAL UNIVERSITY R&DB FOUNDATION, Seoul (KR)

(*) Notice: Subject to any disclaimer, the term of this patent is extended or adjusted under 35 U.S.C. 154(b) by 0 days.

(21) Appl. No.: 15/395,493

(22) Filed: Dec. 30, 2016

(65) Prior Publication Data
US 2017/0221577 A1 Aug. 3, 2017

(30) Foreign Application Priority Data

Jan. 29, 2016 (KR) .................. 10-2016-0011612

(51) Int. Cl.
| H01L 27/22 | (2006.01) |
| G11C 19/08 | (2006.01) |
| H01L 43/02 | (2006.01) |
| H01L 43/08 | (2006.01) |

(52) U.S. Cl.
CPC .......... *G11C 19/0841* (2013.01); *H01L 27/22* (2013.01); *H01L 43/02* (2013.01); *H01L 43/08* (2013.01)

(58) Field of Classification Search
CPC ......... H01L 43/08; H01L 43/02; H01L 27/22; G11C 19/0841
See application file for complete search history.

(56) References Cited

U.S. PATENT DOCUMENTS

| 7,267,999 B2* | 9/2007 | Drewes | B82Y 25/00 |
| | | | 257/E21.665 |
| 2007/0196697 A1* | 8/2007 | Lee | G11B 5/667 |
| | | | 428/828.1 |
| 2007/0242505 A1* | 10/2007 | Ochiai | G11C 11/14 |
| | | | 365/171 |
| 2008/0204946 A1* | 8/2008 | Ochiai | G11C 11/14 |
| | | | 360/324.12 |

(Continued)

OTHER PUBLICATIONS

Haazen, et. al., "Domain wall depinning governed by the spin Hall effect," Nature Materials, vol. 12, pp. 299-303 dated Feb. 3, 2013.

*Primary Examiner* — Syed Gheyas
(74) *Attorney, Agent, or Firm* — Jenkins, Wilson, Taylor & Hunt, P.A.

(57) ABSTRACT

A magnetic domain wall (MDW) motion device. The MDW motion device may include a ferromagnetic layer with perpendicular magnetic anisotropy and non-magnetic metal layers extending parallel to and in contact with the ferromagnetic layer. The ferromagnetic layer may include first ferromagnetic regions, which are arranged in an extension direction of the ferromagnetic layer, and second ferromagnetic regions, which are provided between an adjacent pair of the first ferromagnetic regions. The first and second ferromagnetic regions may have spin torque coefficients of opposite signs, and an MDW positioned near an interface between the first and second ferromagnetic regions may be moved by an in-plane current flowing through the non-magnetic metal layer.

17 Claims, 8 Drawing Sheets

(56) References Cited

U.S. PATENT DOCUMENTS

| | | | |
|---|---|---|---|
| 2009/0040883 A1* | 2/2009 | Kim | G11C 11/14 369/13.41 |
| 2009/0207643 A1* | 8/2009 | Joe | G11C 19/0808 365/85 |
| 2010/0085659 A1* | 4/2010 | Choe | G11B 5/02 360/77.01 |
| 2010/0188890 A1* | 7/2010 | Fukami | B82Y 10/00 365/158 |
| 2011/0085258 A1* | 4/2011 | Bae | B82Y 25/00 360/31 |
| 2016/0181512 A1* | 6/2016 | Ahn | H01L 43/08 257/421 |
| 2016/0247550 A1* | 8/2016 | Fukami | H01L 43/08 |
| 2016/0276007 A1* | 9/2016 | Sugiyama | G11C 11/161 |
| 2016/0365506 A1* | 12/2016 | Ahn | H01L 43/08 |

* cited by examiner

MAGNETIC DOMAIN WALL MOTION DEVICE BASED ON MODULATION OF SPIN-ORBIT TORQUE

CROSS-REFERENCE TO RELATED APPLICATION

This U.S. non-provisional patent application claims priority under 35 U.S.C. § 119 to Korean Patent Application No. 10-2016-0011612, filed on Jan. 29, 2016, in the Korean Intellectual Property Office, the entire content of which is incorporated by reference herein.

BACKGROUND

The present disclosure relates to a memory or logic device based on a magnetic domain wall (MDW), and in particular, to a technology of controlling a position of a MDW in a MDW-based memory or logic device.

As the information industry develops, it is necessary to process a large amount of information, and thus, there is a continuously increasing demand for a memory or logic device, which is configured to store or process such a large amount of information. A hard disk drive (HDD) is widely used as a storage medium, to or from which information is written or read. The HDD is generally used to store a large amount of information (e.g., larger than several TeraBytes), and the reading and writing operations of the HDD may include rotating a mechanical head and a disk using a rotating component. However, the presence of such a mechanically rotating component means that the HDD suffers from mechanical abrasion or operational failure, which may lead to low reliability in data storing characteristics of the HDD. In addition, due to the presence of the mechanical component, the HDD is vulnerable in terms of stability and portability, and thus, there are several difficulties in using the HDD as a next-generation information storage medium.

A memory device, in which a ferromagnetic material with magnetic domain wall is used, has been proposed as a next-generation information storage medium, and there are many studies on such a ferromagnetic memory device. A ferromagnetic material may include a region, which has the same magnetization direction and is called 'a magnetic domain'. When the ferromagnetic material has several magnetic domains, adjacent ones of the magnetic domains may have different magnetization directions and an interface therebetween is called a magnetic domain wall. Magnetic domains in a ferromagnetic material have sizes and magnetization directions that can be changed by a magnetic field or an electric current applied from the outside, and this property of the ferromagnetic material may be used to move the magnetic domain wall therein.

Stuart Parkin, a physicist at IBM's Almaden Research Center, in San Jose, Calif., proposed a magnetic racetrack memory using the motion of a magnetic domain wall caused by an electric current, not using the motion of the mechanical component. In such a magnetic racetrack memory, opposite magnetization directions of magnetic domains are stored as data in a magnetic nanowire. A data writing operation of the magnetic racetrack memory may include a step of changing a magnetization direction of a magnetic domain, and a magnetic field produced from a magnetic domain wall of a writing device may be used for the data writing operation. A data reading operation of the magnetic racetrack memory may include a step of reading a difference in resistance of a magnetic tunnel junction of a reading device attached to the magnetic nanowire. If an electric current is applied to flow through a magnetic nanowire, magnetic domains and magnetic domain walls of the magnetic nanowire may be moved at the same time, and this makes it possible to access data stored in a desired position of the magnetic nanowire.

While an idea and concept of the magnetic racetrack memory have been established, there are many technical challenges that should be overcome to realize the magnetic racetrack memory. For example, in order to move a magnetic domain wall of a magnetic nanowire, it is necessary to increase a current density to be applied to the magnetic nanowire, but this may lead to various problems e.g., heating of the nanowire), and thus, it is necessary to reduce a current density of a current. Also, the motion speed of the magnetic domain wall is slow, and it is necessary to uniformly move many magnetic domain walls by a desired distance and to pin the magnetic domain walls to desired positions. For these purposes, further research is required in the future.

SUMMARY

Some embodiments of the inventive concept provide a memory or logic device, in which a spin-orbit torque is used to move a magnetic domain wall (i.e., to control a position of the magnetic domain wall), and a method of controlling a position of a magnetic domain wall of the memory or logic device.

Some embodiments of the inventive concept provide a memory or logic device, which is configured to spatially modulate a sign of a spin torque coefficient and to move a magnetic domain wall using a spin-orbit torque, and a method of pinning a magnetic domain wall of the memory or logic device.

Some embodiments of the inventive concept provide a method capable of spatially modulating a sign of a spin torque coefficient to pin a magnetic domain wall and selecting a direction of motion of the magnetic domain wall.

According to some embodiments of the inventive concept, a magnetic domain wall (MDW) motion device may include a ferromagnetic layer with perpendicular magnetic anisotropy and a non-magnetic metal layer extending parallel to and in contact with the ferromagnetic layer. The ferromagnetic layer may include first ferromagnetic regions, which are arranged in an extension direction of the ferromagnetic layer, and second ferromagnetic regions, which are provided between an adjacent pair of the first ferromagnetic regions. The first and second ferromagnetic regions may have spin torque coefficients of opposite signs, and an MDW positioned at an interface between the first and second ferromagnetic regions may be moved by an in-plane current flowing through the non-magnetic metal layer.

In some embodiments, the spin torque coefficients of the first and second ferromagnetic regions may be determined by a structure or a constitution of the ferromagnetic layer.

In some embodiments, a sign of the spin torque coefficient of one of the first and second ferromagnetic regions may be changed through doping of oxygen atoms.

In some embodiments, the non-magnetic metal layer may include an upper non-magnetic metal layer provided to be adjacent to a top surface of the ferromagnetic layer and a lower non-magnetic metal layer provided to be adjacent to a bottom surface of the ferromagnetic layer.

In some embodiments, each of the first and second ferromagnetic regions may include a notch that is provided at the interface between the first and second ferromagnetic regions in contact with each other and has a reduced width.

A narrowest portion of the notch may be not aligned to the interface between the first and second ferromagnetic regions.

In some embodiments, the notch may include a first notch region with a rapidly decreasing width and a second notch region with a gently increasing width, and the notch may have a unit length corresponding to a length of the first or second ferromagnetic region. A start position of the first notch region may be aligned to the interface between the first and second ferromagnetic regions, and an end position of the second notch region may be aligned to another interface between the first and second ferromagnetic regions and may be spaced apart from the start position of the first notch region by the unit length.

In some embodiments, the ferromagnetic layer may further include an auxiliary pinning region provided near the interface between the first and second ferromagnetic regions, and the auxiliary pinning region may be provided in such a way that its center is not aligned to the interface between the first and second ferromagnetic regions.

In some embodiments, the auxiliary pinning region may include an impurity injected in the ferromagnetic layer, and the impurity may include at least one of oxygen, fluorine, nitrogen, metal, transition metals, or gallium.

According to some embodiments of the inventive concept, a magnetic domain wall (MDW) motion device may include a ferromagnetic layer with perpendicular magnetic anisotropy and a non-magnetic metal layer extending parallel to and in contact with the ferromagnetic layer. The non-magnetic metal layer may include first non-magnetic regions, which are arranged in an extension direction of the non-magnetic metal layer, and second non-magnetic regions, which are provided between an adjacent pair of the first non-magnetic regions. Two portions of the ferromagnetic layer corresponding to the first and the second non-magnetic regions may have spin torque coefficients of opposite signs, and an MDW positioned at an interface between the two portions of the ferromagnetic layer corresponding to the first and the second non-magnetic regions may be moved by an in-plane current flowing through the non-magnetic metal layer.

In some embodiments, the non-magnetic metal layer may include an upper non-magnetic metal layer provided to be adjacent to a top surface of the ferromagnetic layer and a lower non-magnetic metal layer provided to be adjacent to a bottom surface of the ferromagnetic layer. A thickness of the upper non-magnetic metal layer in the first non-magnetic region may be different from that in the second non-magnetic region, and a thickness of the lower non-magnetic metal layer in the first non-magnetic region may be different from that in the second non-magnetic region.

In some embodiments, a thickness of the non-magnetic metal layer in the first non-magnetic region may be different from that in the second non-magnetic region.

In some embodiments, the ferromagnetic layer may include a notch whose width is locally reduced for each of the first and second non-magnetic regions, and a narrowest portion of the notch may be not aligned to the interface between the first and second non-magnetic regions.

In some embodiments, the notch may include a first notch region with a rapidly decreasing width and a second notch region with a gently increasing width, and the notch may have a unit length corresponding to a length of the first or second non-magnetic region. A start position of the first notch region may be aligned to the interface between the first and second non-magnetic regions, and an end position of the second notch region may be aligned to another interface between the first and second non-magnetic regions and may be spaced apart from the start position of the first notch region by the unit length.

In some embodiments, the ferromagnetic layer may further include an auxiliary pinning region provided near the interface between the first and second non-magnetic regions, and the auxiliary pinning region may be provided in such a way that its center is not aligned to the interface between the first and second non-magnetic regions.

In some embodiments, the auxiliary pinning region may include an impurity injected in the ferromagnetic layer, and the impurity may include at least one of oxygen, fluorine, nitrogen, metal, transition metals, or gallium.

According to some embodiments of the inventive concept, a nanowire may include a ferromagnetic layer with perpendicular magnetic anisotropy and a non-magnetic metal layer extending parallel to and in contact with the ferromagnetic layer. The nanowire may include first and second regions which are alternately arranged in an extension direction of the nanowire, and the first and second regions may have spin torque coefficients of opposite signs. An MDW of the ferromagnetic layer at an interface between the first and second regions may be moved by an in-plane current flowing through the non-magnetic metal layer.

In some embodiments, the nanowire may further include a motion direction selection unit configured to select a direction of motion of the MDW in a state in which the in-plane current is removed.

In some embodiments, the motion direction selection unit may be a notch formed in the ferromagnetic layer, an impurity doped region formed in the ferromagnetic layer, or a magnetic field applying element additionally provided near the nanowire.

In some embodiments, the spin torque coefficient may be spatially modulated by locally injecting oxygen impurities into the ferromagnetic layer or by locally modulating a thickness of the non-magnetic metal layer.

In some embodiments, the spin torque coefficient may be spatially modulated by modulating an interface between the ferromagnetic layer and the non-magnetic layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
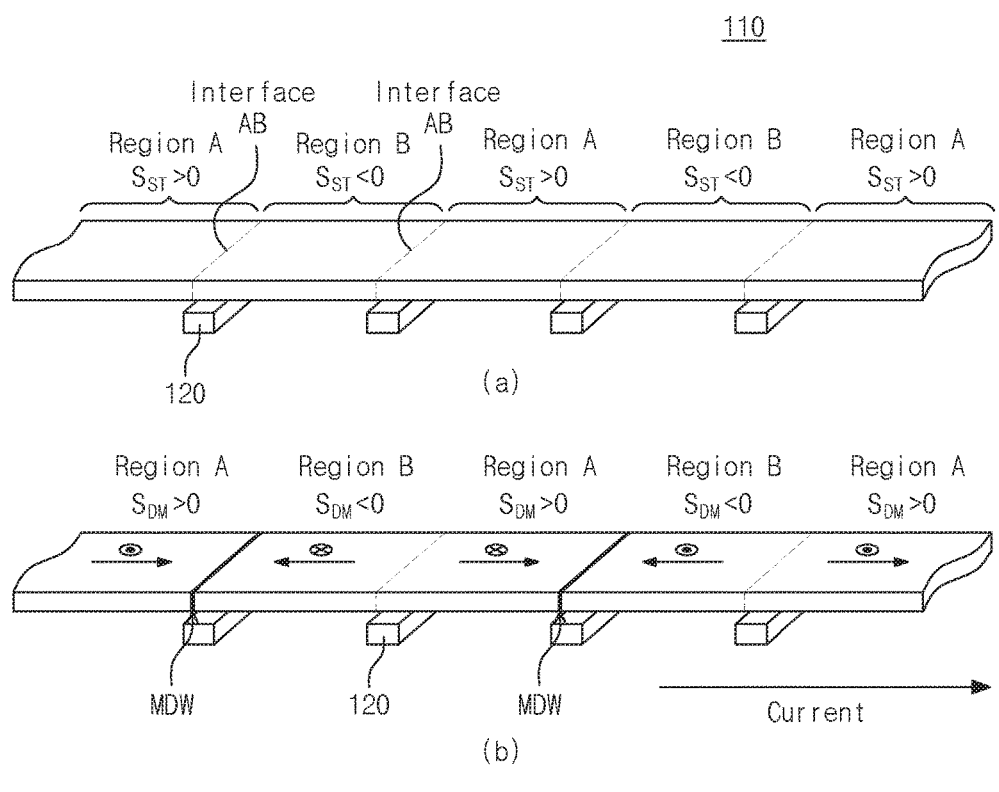
FIG. 1 is a diagram schematically illustrating a nanowire according to example embodiments of the inventive concept.

It should be noted that these figures are intended to illustrate general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A ferromagnetic material with perpendicular magnetic anisotropy may become a stable state of lower energy, when it has a magnetization direction aligned to a vertical direction. In such a stable state, two magnetization states are allowed in the ferromagnetic material. For example, the ferromagnetic material may have a magnetization direction parallel or antiparallel to a vertical axis. A magnetization direction of a magnetic domain may correspond to digital data of "1" or "0", and thus, the magnetic domain may be used as a memory device. In the case where a nano/micro process is applied to the ferromagnetic material the perpendicular magnetic anisotropy, it is possible to form a nanowire structure with a small width, and the nanowire structure may be used as a memory device (e.g., a magnetic domain wall (MDW) racetrack memory device proposed by Parkin), which is used to store digital information. In order to operate the MDW racetrack memory device, it is necessary to uniformly and simultaneously move all MDWs in a length direction of the device. The uniform motion of the MDW can be achieved by producing a current flow in the length direction of the device.

To develop a memory device in which an MDW is moved by applying the current, it is necessary to precisely control a position of the MDW. To pin an MDW to a desired position, there has been suggested a technology of additionally forming a notch structure in the nanowire of the memory device, but the notch structure alone is insufficient to pin the MDW.

An MDW pinning is one of key technologies for the memory device using the MDW motion. If an MDW starts to be moved by a current applied to a magnetic track, it should be stopped (i.e., pinned) at a desired position of the magnetic track, when a distance of its motion reaches a specific length. In this case, it is possible to control the motion of the MDW in the unit of one bit.

A notch is mainly used to pin an MDW. For example, a notch formed in a magnetic track may be used as a pinning site of an MDW. However, in the case where the notch alone is used to pin the MDW, various problems may occur. For example, it may be necessary to increase a size of the notch. In addition, a current flowing through the magnetic track may be concentrated at the notch, and this may lead to various other problems (e.g., generation of heat, deterioration in reliability of data stored in the magnetic track, and damage of the magnetic track itself). Furthermore, in the case where a magnetic track is of several tens of nanometers in thickness and width, it is not easy to form a large-sized notch in the magnetic track. It is much difficult to uniformly form large-sized notches e.g., in space, size, and shape). However, if the notch is non-uniform in space, size, and shape, there may be a variation in magnitude of pinning magnetic field for stopping the MDW. Thus, when the notch alone is used to pin the MDW, there may be non-uniformity in characteristics of the device.

According to some embodiments of the inventive concept, a current-induced MDW motion (CIDWM) device, in which motion of an MDW is caused by a spin-orbit torque, may be provided to include regions which are arranged in an alternate manner. Spin torque coefficients of the regions may have at least two different signs and this may make it possible to stop the motion of the MDW at a desired position.

Some embodiments of the inventive concept are based on the following principles. Firstly, a current-induced MDW motion is caused by the phenomenon called spin torque. Secondly, a direction of MDW motion is dependent on a sign in the spin torque effect. Thirdly, the sign of the spin torque effect is dependent on a constitution and a structure of a device. Fourthly, local sign or magnitude of the spin torque effect is modulated by locally modulating a constitution and a structure of the device. Accordingly, the direction of MDW motion can be locally modulated. Fifthly, by locally modulating the direction of MDW motion, it is possible to pin the MDW at a desired position of the device. In addition, a direction selector (e.g., a notch) for selecting a direction of motion of the MDW may be used to move the MDW in a desired direction. The direction selector may be configured to allow the MDW to be naturally moved to a region whose spin torque coefficient has the same sign as that thereof, in a state of no in-plane current.

FIG. 1 is a diagram schematically illustrating a nanowire according to example embodiments of the inventive concept.

Referring to FIG. 1, a nanowire 110 may include a ferromagnetic layer, which is provided on a substrate and has perpendicular magnetic anisotropy, and a non-magnetic metal layer, which extends parallel to and in contact with the ferromagnetic layer. The nanowire 110 may include a plurality of first regions A and a plurality of second regions B which are alternately arranged in an extension direction of the nanowire 110. The first and second regions A and B may have spin torque coefficients of opposite signs. At an interface AB between the first and second regions A and B, a magnetic domain wall (MDW) of the ferromagnetic layer may be moved by an in-plane current flowing through the non-magnetic metal layer.

A motion direction selection unit 120 may be used to select a direction of motion of the MDW in a state of no in-plane current flowing through the non-magnetic metal layer. The motion direction selection unit 120 may be a notch formed in the ferromagnetic layer, an impurity doped region formed in the ferromagnetic layer, or an additional magnetic field applying element provided near the nanowire.

The ferromagnetic layer may include a material, in which magnetization directions tend to be aligned in the same direction. The ferromagnetic layer may be formed of or include pure ferromagnetic materials (e.g., cobalt (Co), iron (Fe), and nickel (Ni)), alloys thereof, or a multi-layered structure thereof.

The non-magnetic metal layer may be formed of or include at least one of platinum (Pt), palladium (Pd), tantalum (Ta), titanium (Ti), tungsten (W), or gold (Au). The non-magnetic metal layer may be provided in the form of a thin film whose thickness ranges from several angstroms to several nanometers.

The ferromagnetic layer may be provided in the form of a thin film whose thickness ranges from several angstroms to several nanometers. The ferromagnetic layer may be stacked on the non-magnetic metal layer.

By covering the ferromagnetic layer with the non-magnetic metal layer, oxide materials (e.g., magnesium oxide (MgO) and silicon oxide ($SiO_2$)), or nitride materials (e.g., silicon nitride ($SiN_3$)), a ferromagnetic layered structure with perpendicular magnetic anisotropy may be formed.

The thin-film stacked to form the nanowire 110 may be patterned through a lithography process. A structure of the nanowire may be classified into two types: 1) non-magnetic metal layer/ferromagnetic layer/non-magnetic metal layer and 2) non-magnetic metal layer/ferromagnetic layer/oxide layer.

The term 'perpendicular magnetic anisotropy (PMA)' refers to a state in which spins are aligned in a direction normal to a plane. The ferromagnetic thin-film structure with the perpendicular magnetic anisotropy may include a plurality of domains, which are have magnetization directions parallel or antiparallel to the normal direction normal and are called magnetic domains, and an interface between the magnetic domains may be called a magnetic domain wall (MDW).

In the past, a spin-transfer torque theory has been used to explain a current-induced MDW motion (CIDWM) which occurs when a non-magnetic metal layer is not provided, but for a nanowire including a non-magnetic metal layer, Dzyaloshinskii-Moriya interaction (DMI) and a spin-orbit torque theory are used to explain the CIDWM.

In the case where a nanowire is configured to include a non-magnetic metal layer and a ferromagnetic layer and to exhibit the perpendicular magnetic anisotropy, a spin Hall effect or a Rashba effect in the non-magnetic metal layer may be exploited to produce a spin current or spin-Hall current in the ferromagnetic layer and to move an MDW in the nanowire. The spin current or the spin-Hall current may be injected into the ferromagnetic layer. The spin-Hall current may be used to quickly move the MDW through a spin-orbit torque, without any external magnetic field. The motion of the MDW caused by the spin-orbit torque may be faster than that in a conventional method using a spin-transfer torque caused by a current of electric charges flowing through a ferromagnetic material.

However, even in a case of a CIDWM device using the spin-orbit torque, it is also necessary to develop a pinning technology for pinning an MDW to a desired position in the unit of bit and a driving technology for moving the MDW in a desired direction in the unit of bit.

In the case where a current flows through the non-magnetic metal layer, a spin torque effect may lead to a unidirectional motion of an MDW of the ferromagnetic layer. An MDW memory logic device using this effect has been suggested and developed. However, for a spin-orbit torque-based MDW device, technology capable of selectively pinning an MDW to a desired position may be needed.

According to some embodiments of the inventive concept, by locally modulating a sign of a spin torque effect, it may be possible to pin an MDW to a desired position, in a spin orbit torque-based MDW device. The principle is as follows.

A motion direction $S_{DM}$ of the MDW may be determined by multiplication of a sign of a spin torque coefficient ($S_{ST}$) and a sign of an applied current ($S_J$); i.e., $S_{DM}=S_{ST}\times S_J$. Here, the sign $S_{ST}$ may be given by multiplication of a sign of a spin orbit torque ($S_{SOT}$) and a sign of an asymmetric exchange coupling or Dzyaloshinskii Moriya interaction ($S_{DMI}$); i.e., $S_{ST}=S_{SOT}\times S_{DMI}$. Here, the spin orbit torque may be caused by a spin-Hall or Rashba effect.

If the sign $S_{SOT}$ or $S_{DMI}$ of a partial region of a CIDWM device is periodically modulated along an extension direction of the device, it may be possible to produce a region with an opposite sign of the spin torque coefficient ($S_{ST}$). Accordingly, the sign of the spin torque coefficient may be alternately changed along the extension direction of the CIDWM device. The modulation of the sign of the spin torque coefficient may be achieved by modulating a spin orbit torque.

The first region A may have a positive spin torque coefficient, and the second region B may have a negative spin torque coefficient. The first and second regions A and B may be alternately disposed, and thus, the MDW may be pinned to the interface AB between the first and second regions A and B.

Spatial modulation of the spin torque coefficient may be achieved by injecting impurities (e.g., oxygen) into a portion of the ferromagnetic layer injection or by modulating a thickness of a portion of the non-magnetic metal layer. The spatial modulation of the spin torque coefficient may be achieved by an interface modulation on an interface between the ferromagnetic layer and the non-magnetic layer. The interface modulation may be realized by depositing a layer a palladium layer), which has a thickness of several nanometers or less, on one of the first and second regions A and B.

The spatial modulation of the spin torque coefficient may be used to pin an MDW to a desired position. However, in the case where an in-plane current flowing through the non-magnetic metal layer is used, it may be difficult to control a direction of motion of the MDW. Accordingly, there is a need for a direction selector which is configured to move the MDW in a desired direction to select a direction of motion of the MDW.

A motion direction selection unit 120 may be a notch formed in the ferromagnetic layer, an impurity doped region formed in the ferromagnetic layer, or a magnetic field applying element additionally provided near the nanowire. The notch formed in the ferromagnetic layer may be used to move the MDW pinned to the interface AB to a specific spin torque modulation region, in a state of no current. Accordingly, all of the MDWs may be slightly moved to the spin torque modulation region (e.g., the second region B) with the same sign. The direction of the arrow depicts a motion direction $S_{DM}$ of the MDW.

Accordingly, in the case where all of the MDWs are moved to the spin torque modulation region with the same sign, a spin-orbit torque caused by an in-plane current may be used to move the MDW in a desired direction. The nanowire may be used to realize a logic device, a racetrack memory device, and so forth.

Figure 2:
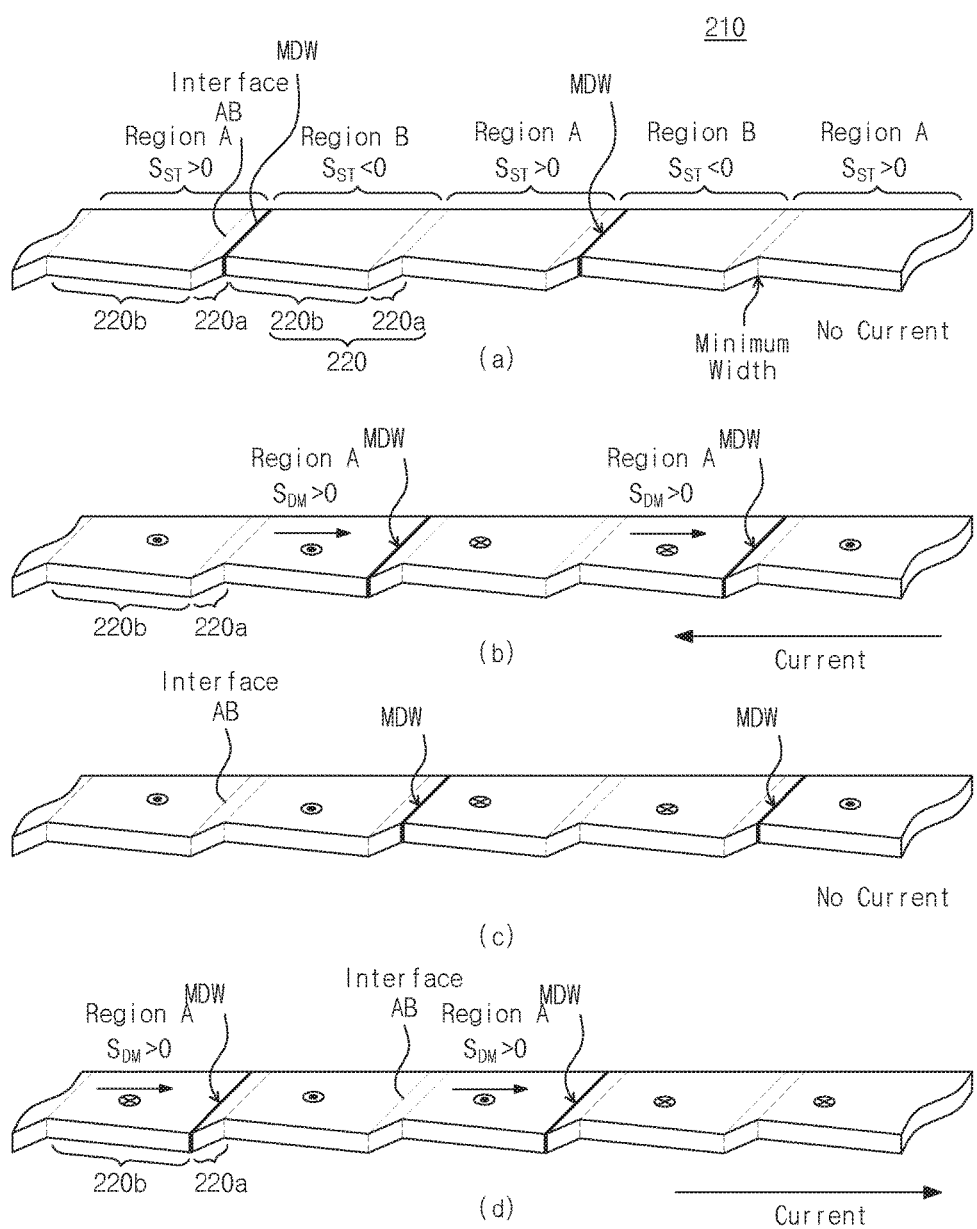
FIG. 2 is a diagram schematically illustrating a nanowire, which is embedded with a motion direction selection unit, according to other example embodiments of the inventive concept.

FIG. 2 is a diagram schematically illustrating a nanowire, which is embedded with a motion direction selection unit, according to other example embodiments of the inventive concept.

Referring to FIG. 2, a nanowire 210 may include a ferromagnetic layer, which is provided on a substrate and is configured to exhibit perpendicular magnetic anisotropy, and a non-magnetic metal layer, which extends parallel to and in contact with the ferromagnetic layer. The nanowire 210 may include a plurality of first regions A and a plurality of second regions B which are alternately arranged in an extension direction of the nanowire 210. Spin torque coefficients of the first and second regions A and B may have opposite signs. At the interface AB between the first and second regions A and B, an MDW in the ferromagnetic layer may be moved by an in-plane current flowing through the non-magnetic metal layer.

A motion direction selection unit 220 may be used to select a direction of motion of the MDW in a state of no in-plane current. The motion direction selection unit 220 may be a notch that is formed in the ferromagnetic layer. The notch may be formed by locally reducing a width of the ferromagnetic layer, and the narrowest portion of the ferromagnetic layer may be formed adjacent to the interface AB but may not aligned to the interface AB. For example, the widest portion of the notch may be positioned to coincide with the interface AB or may be positioned at a right side of the interface AB. If, after pinning the MDW to the widest portion of the notch through spin-torque modulation, the current is removed, the MDW may be moved to the narrowest portion of the notch. Accordingly, all of the MDWs may be positioned at the second regions B with negative spin torque coefficients. Accordingly, a negative in-plane current may be used to simultaneously move all of the MDWs in a positive direction.

Figure 3:
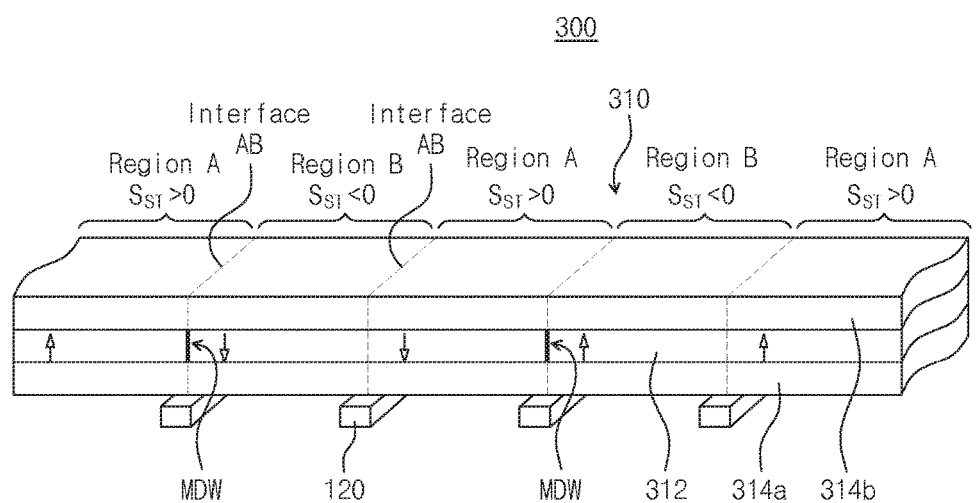
FIG. 3 is a diagram schematically illustrating a magnetic domain wall (MDW) motion device according to still other example embodiments of the inventive concept.

FIG. 3 is a diagram schematically illustrating a MDW motion device according to still other example embodiments of the inventive concept.

Referring to FIG. 3, an MDW motion device 300 may include a nanowire 310. The nanowire 310 may include a ferromagnetic layer 312 with perpendicular magnetic anisotropy and non-magnetic metal layers 314a and 314b extending parallel to and in contact with the ferromagnetic layer 312. The ferromagnetic layer 312 may include first ferromagnetic regions A, which are arranged in an extension direction of the ferromagnetic layer, and second ferromagnetic regions B, each of which is provided between each pair of the first ferromagnetic regions A. The first and second ferromagnetic regions A and B may have spin torque coefficients of opposite signs. An MDW positioned at an interface AB between adjacent ones of the first and second ferromagnetic regions A and B may be moved by an in-plane current flowing through the non-magnetic metal layers 314a and 314b.

The non-magnetic metal layers 314a and 314b may include a lower non-magnetic metal layer 314a under the ferromagnetic layer 312 and an upper non-magnetic metal layer 314b on the ferromagnetic layer 312. The lower non-magnetic metal layer 314a or the upper non-magnetic metal layer 314b may be formed of or include at least one of platinum (Pt), palladium (Pd), tantalum (Ta), titanium (Ti), tungsten (W), or gold (Au). The lower non-magnetic metal layer 314a or the upper non-magnetic metal layer 314b may be provided in the form of a thin film whose thickness ranges from several angstroms to several nanometers.

For example, the first ferromagnetic region A may have a positive spin torque coefficient, and the second ferromagnetic region B may have a negative spin torque coefficient, in some embodiments, the spin torque coefficients of the first and second ferromagnetic regions A and B may have the same absolute value.

A region depicted by the reference letter 'A' may have a spin torque coefficient $S_{ST}$ of a positive sign, and a region depicted by the reference letter 'B' may have a spin torque coefficient $S_{ST}$ of a negative sign. In the case where a current of a positive sign flows through the non-magnetic metal layer, an MDW in the first ferromagnetic region A may move in a positive direction, and an MDW in the second ferromagnetic region B may move in a negative direction. Accordingly, all MDWs may be pinned to the interface AB between the first and second ferromagnetic regions A and B.

A motion direction selection unit 120 may be provided to be spaced apart from the nanowire 310 or to be integrated in the nanowire 310. The motion direction selection unit 120 may be a notch formed in the ferromagnetic layer, an impurity doped region formed in the ferromagnetic layer, or a magnetic field applying element additionally provided near the nanowire. The notch formed in the ferromagnetic layer may be used to move the MDW pinned to the interface AB to a specific spin torque modulation region, in a state of no current. Accordingly, all of the MDWs may be slightly moved to the spin torque modulation region (e.g., the first region A or the second region B) with the same sign.

Figure 4:
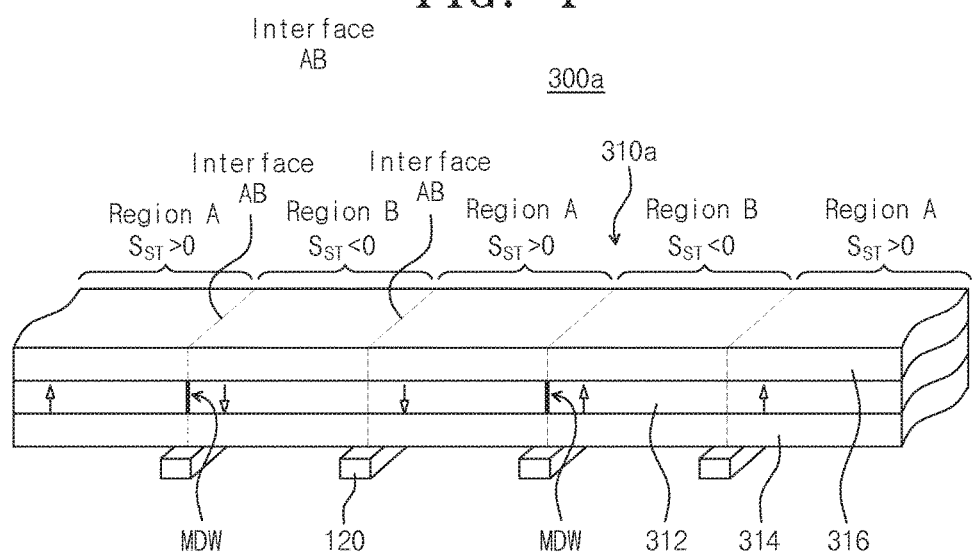
FIG. 4 is a diagram schematically illustrating a MDW motion device according to yet other example embodiments of the inventive concept.

FIG. 4 is a diagram schematically illustrating a MDW motion device according to yet other example embodiments of the inventive concept.

Referring to FIG. 4, an MDW motion device 300a may include a ferromagnetic layer 312 with perpendicular magnetic anisotropy and a non-magnetic metal layer 314 extending parallel to and in contact with the ferromagnetic layer 312. The ferromagnetic layer 312 may include first ferromagnetic regions A, which are arranged in an extension direction of the ferromagnetic layer, and second ferromagnetic regions B, each of which is provided between each pair of the first ferromagnetic regions A. The first and second ferromagnetic regions A and B may have spin torque coefficients of opposite signs. An MDW positioned at an interface AB between adjacent ones of the first and second ferromagnetic regions A and B may be moved by an in-plane current flowing through the non-magnetic metal layer.

A nanowire 310a may include a non-magnetic metal layer 314, a ferromagnetic layer 312, and an oxide layer 316 which are sequentially stacked on a substrate. The oxide layer 316 may be formed of or include at least one of oxide materials (e.g., magnesium oxide (MgO) and silicon oxide ($SiO_2$)) or nitride materials (e.g., silicon nitride ($SiN_3$)).

The non-magnetic metal layer 314 may be formed of or include at least one of platinum (N), palladium (Pd), tantalum (Ta), titanium (Ti), tungsten (W), or gold (Au). The non-magnetic metal layer 314 may be provided in the form of a thin film whose thickness ranges from several angstroms to several nanometers.

The ferromagnetic layer 312 may be formed of or include pure ferromagnetic materials (e.g., cobalt (Co), iron (Fe), and nickel (Ni)), alloys thereof, or a multi-layered structure.

A motion direction selection unit 120 may be provided to be spaced apart from the nanowire 310a or to be integrated in the nanowire 310a. The motion direction selection unit 120 may be a notch formed in the ferromagnetic layer, an impurity doped region formed in the ferromagnetic layer, or a magnetic field applying element additionally provided near the nanowire. The notch formed in the ferromagnetic layer may be used to move the MDW pinned to the interface AB to a specific spin torque modulation region, in a state of no current. Accordingly, all of the MDWs may be slightly moved to the spin torque modulation region (e.g., the first region A or the second region B) with the same sign.

Figure 5:
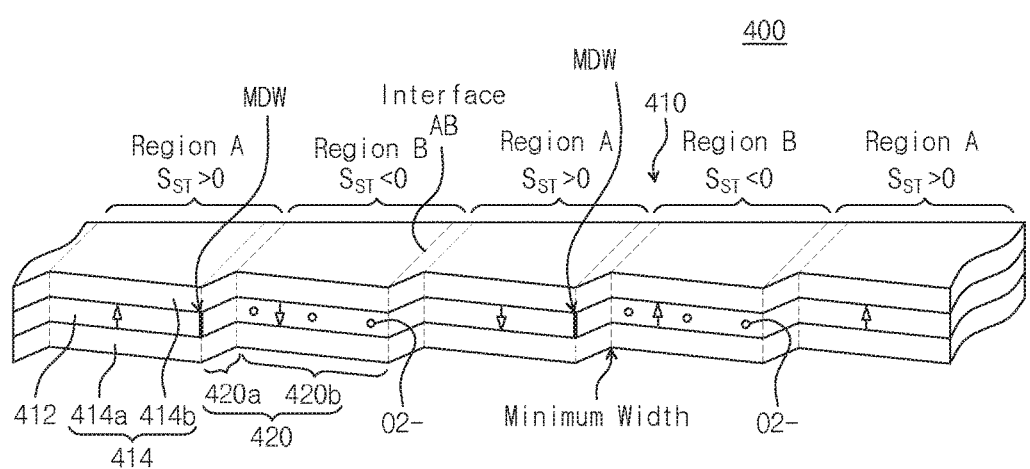
FIG. 5 is a diagram schematically illustrating a MDW motion device according to even other example embodiments of the inventive concept.
Figure 6:
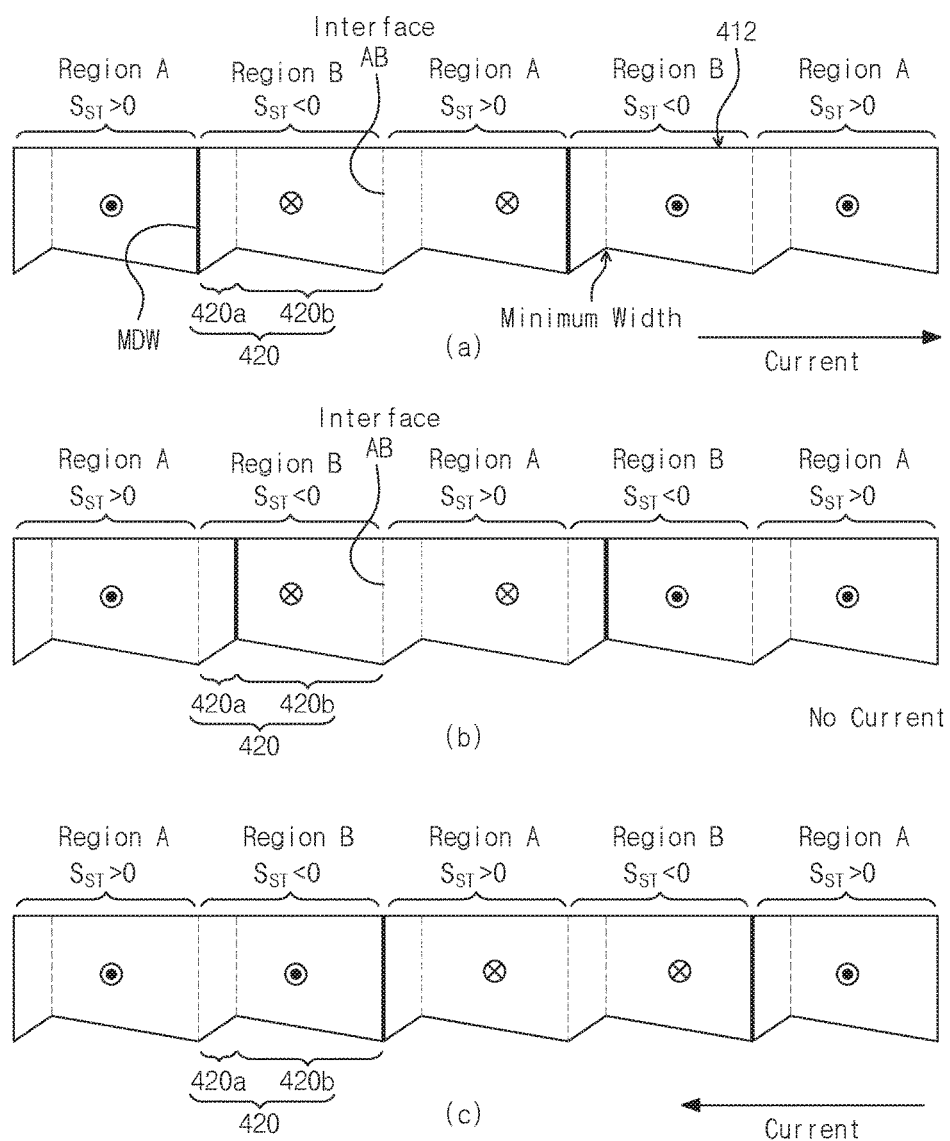
FIG. 6 is a plan view illustrating an operation of the MDW motion device of FIG. 5.

FIG. 5 is a diagram schematically illustrating a MDW motion device according to even other example embodiments of the inventive concept. FIG. 6 is a plan view illustrating an operation of the MDW motion device of FIG. 5.

Referring to FIGS. 5 and 6, a MDW motion device 400 may include a ferromagnetic layer 412 with perpendicular magnetic anisotropy and a non-magnetic metal layer 414 extending parallel to and in contact with the ferromagnetic layer 412. The ferromagnetic layer 412 may include first ferromagnetic regions A, which are arranged in an extension direction of the ferromagnetic layer 412, and second ferromagnetic regions B, each of which is provided between each adjacent pair of the first ferromagnetic regions A. The first and second ferromagnetic regions may have spin torque coefficients of opposite signs, and an MDW positioned at an interface AB between the first and second ferromagnetic regions A and B may be moved by an in-plane current flowing through the non-magnetic metal layer.

Spin torque coefficients of the first and second ferromagnetic regions A and B may be determined depending on a structure or constitution of the ferromagnetic layer. In detail, a sign of the spin torque coefficient of one of the first and second ferromagnetic regions A and B may be changed by a dopant material. The dopant material may be oxygen or an oxygen-containing material.

The non-magnetic metal layer 414 may include an upper non-magnetic metal layer 414b provided on a top surface of the ferromagnetic layer and a lower non-magnetic metal layer 414a provided on a bottom surface of the ferromagnetic layer. The upper non-magnetic metal layer may be formed of the same material as that of the lower non-magnetic metal layer. The upper non-magnetic metal layer may have the same thickness as that of the lower non-magnetic metal layer.

The ferromagnetic layer 412 may be formed of or include pure ferromagnetic materials (e.g., cobalt (Co), iron (Fe), and nickel (Ni)) or alloys thereof. To selectively dope oxygen atoms into only the second ferromagnetic region B, on which the ferromagnetic layer 412 is formed by a sputtering, the substrate, in which the ferromagnetic layer is exposed, may be deposited with a protection layer, and the protection layer may be patterned to selectively expose only the second ferromagnetic region B. The substrate, in which the second ferromagnetic region B is exposed, may be oxidized under oxygen gas ambient or may be doped with oxygen atoms. A diffusion or ion injection method may be used to inject oxygen into the ferromagnetic layer 412.

Each of the first and second ferromagnetic regions A and B may include a notch 420, which is provided near an interface AB, at which the first and second ferromagnetic regions A and B are in contact with each other, and the notch 420 may be formed to have a decreasing width. The notch may be formed in such a way that its narrowest portion is not aligned to the interface AB between the first and second ferromagnetic regions A and B. The notch 420 may serve as a in direction selector for selecting a direction of motion of the MDW.

The notch 420 may include a first notch region 420a with a rapidly decreasing width and a second notch region 420b with a gently increasing width. The notch 420 may have a unit length corresponding to a length of the first ferromagnetic region A or the second ferromagnetic region B. A start point of the first notch region 420a may be aligned to the interface AB between the first and second ferromagnetic regions A and B. An end point of the second notch region 420b may be moved by the unit length to be aligned to the interface AB between the first and second ferromagnetic regions A and B. Accordingly, the widest portion of the notch may be aligned to the interface AB, and the narrowest portion of the notch may be slightly shifted rightward from the interface AB.

If a current is applied, the MDW may be aligned to the interface AB, and if the current is removed, the MDW may be moved to the narrowest portion of the notch 420. Accordingly, all of the MDWs may be moved in a desired direction by the current.

Figure 7:
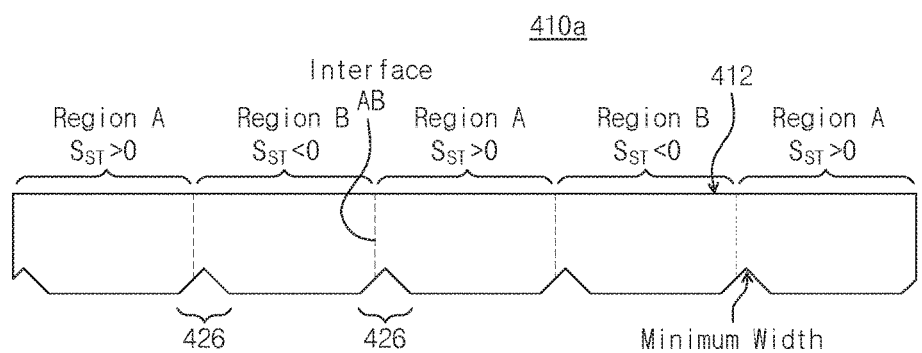
FIG. 7 is a plan view illustrating a MDW motion device according to further example embodiments of the inventive concept.

FIG. 7 is a plan view illustrating a MDW motion device according to further example embodiments of the inventive concept. For the sake of brevity, the elements and features of this example that are similar to those previously shown and described with reference to FIGS. 5 and 6 will not be described in much further detail.

Referring to FIGS. 5 to 7, a notch 426 may serve as a direction selector for selecting a direction of motion of the MDW. The notch 426 may be provided near an interface AB between first and second ferromagnetic regions A and B. In some embodiments, the notch 426 may be formed in such a way that its narrowest portion is not aligned to the interface AB.

Figure 8:
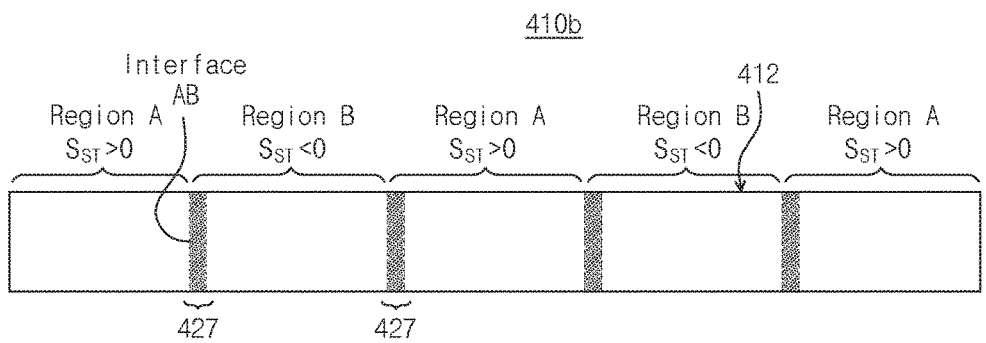
FIG. 8 is a plan view illustrating a MDW motion device according to still further example embodiments of the inventive concept.

FIG. 8 is a plan view illustrating a MDW motion device according to still further example embodiments of the inventive concept. For the sake of brevity, the elements and features of this example that are similar to those previously shown and described with reference to FIGS. 5 and 6 will not be described in much further detail.

Referring to FIGS. 5, 6, and 8, the ferromagnetic layer 412 may include an auxiliary pinning region 427 that is positioned near the interface AB between the first and second ferromagnetic regions A and B. The auxiliary pinning region 427 may be provided in such a way that its center is not aligned to the interface AB between the first and second ferromagnetic regions A and B. The auxiliary pinning region 427 may contain impurities injected into the ferromagnetic layer 412. The impurities may include at least one of oxygen, fluorine, nitrogen, metal, transition metal, or gallium. The auxiliary pinning region 427 may serve as a direction selector for selecting a direction of motion of the MDW. The auxiliary pinning region 427 may be configured to have a weakened magnetization property, compared to other regions of the ferromagnetic layer 412.

Figure 9:
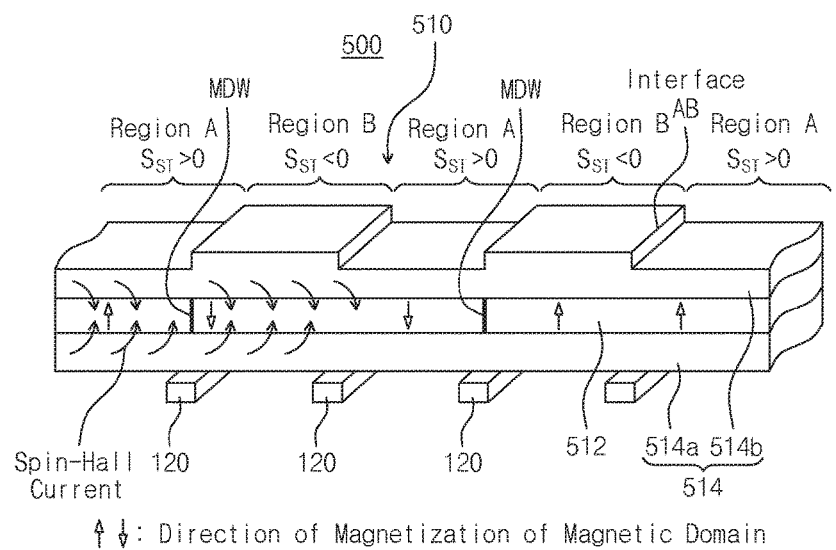
FIG. 9 is a diagram schematically illustrating a MDW motion device according to yet further example embodiments of the inventive concept.

FIG. 9 is a diagram schematically illustrating a MDW motion device according to yet further example embodiments of the inventive concept.

Referring to FIG. 9, an MDW motion device 500 may include a nanowire 510. The nanowire 510 may include a ferromagnetic layer 512 with perpendicular magnetic anisotropy and a non-magnetic metal layer 514 extending parallel to and in contact with the ferromagnetic layer 512. The non-magnetic metal layer 514 may include first non-magnetic regions A, which are arranged in an extension direction of the non-magnetic metal layer 514, and second non-magnetic regions B, each of which is provided between each adjacent pair of the first non-magnetic regions A. Two portions of the ferromagnetic layer 512 corresponding to the first and second non-magnetic regions A and B may have spin torque coefficients of opposite signs. In the case where an MDW is positioned at the interface AB between two portions of the ferromagnetic layer corresponding to the first and second non-magnetic regions A and B, the MDW may be moved by an in-plane current flowing through the non-magnetic metal layer.

The non-magnetic metal layer 514 may include a lower non-magnetic metal layer 514a under the ferromagnetic layer 512 and an upper non-magnetic metal layer 514b on the ferromagnetic layer 512. The lower non-magnetic metal layer 514a or the upper non-magnetic metal layer 514b may be formed of or include at least one of platinum (Pt), palladium (Pd), tantalum (Ta), titanium (Ti), tungsten (W), or gold (Au). The upper non-magnetic metal layer 514b or the lower non-magnetic metal layer 514a may be provided in the form of a thin film whose thickness ranges from several angstroms to several nanometers.

A thickness of the upper non-magnetic metal layer 514b in the first non-magnetic region A may be different from that in the second non-magnetic region B. Alternatively, a thickness of the lower non-magnetic metal layer 514a in the first non-magnetic region A may be different from that in the second non-magnetic region B.

Preferably, the upper non-magnetic metal layer 514b may have a first thickness in the first non-magnetic region A and a second thickness, which is different from the first thickness, in the second non-magnetic region B. The first thickness may be about several nanometers, and the second thickness may be several times the first thickness. For example, the lower non-magnetic metal layer 514a may have a thickness of 3 nm, while the thickness of the upper non-magnetic metal layer 514b may be 2 nm in the first non-magnetic region A and 4 nm in the second non-magnetic region B. Accordingly, a total spin-Hall current of the ferromagnetic layer 512 corresponding to the first non-magnetic region A may have a direction opposite to that of a total spin-Hall current of the ferromagnetic layer 512 corresponding to the second non-magnetic region B.

Thickness modulation of the non-magnetic metal layer 514 may be used to spatially modulate a sign of a spin torque coefficient. Accordingly, in the case where an in-plane current flows through the non-magnetic metal layer 514, the MDW may be pinned to a portion of the ferromagnetic layer corresponding to the interface AB between the first and second non-magnetic regions A and B.

The motion direction selection unit 120 may be used to select a direction of motion of the MDW that is pinned to a region of the ferromagnetic layer corresponding to the interface AB. The motion direction selection unit 120 may be used to select a direction of motion of the MDW in a state of no in-plane current. The motion direction selection unit 120 may be a notch formed in the ferromagnetic layer, doped region formed in the ferromagnetic layer, or a magnetic field applying element additionally provided near the MDW motion device.

Figure 10:
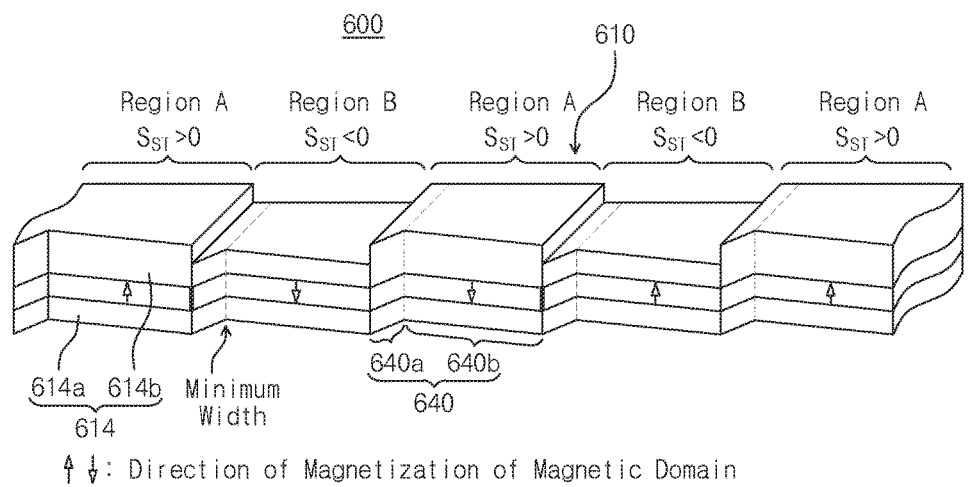
FIG. 10 is a diagram schematically illustrating a MDW motion device according to even further example embodiments of the inventive concept.
Figure 11:
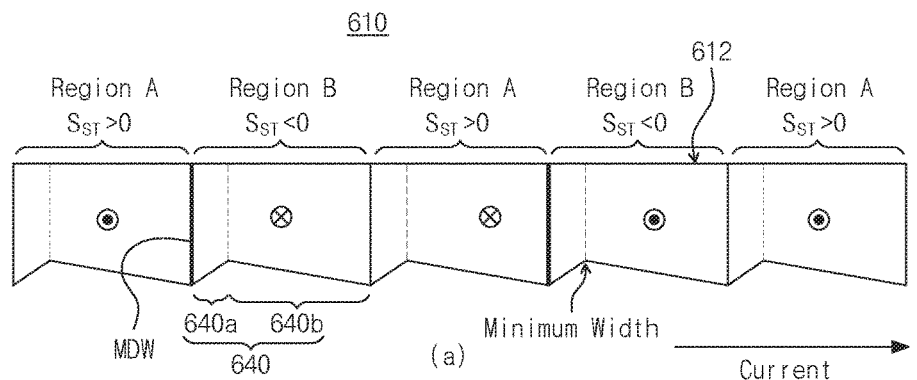
FIG. 11 is a plan view illustrating an operation of the MDW motion device of FIG. 10.
Figure 11:
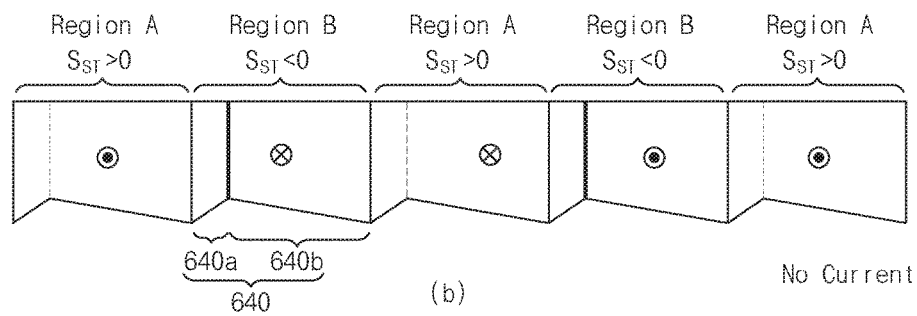
Figure 11:
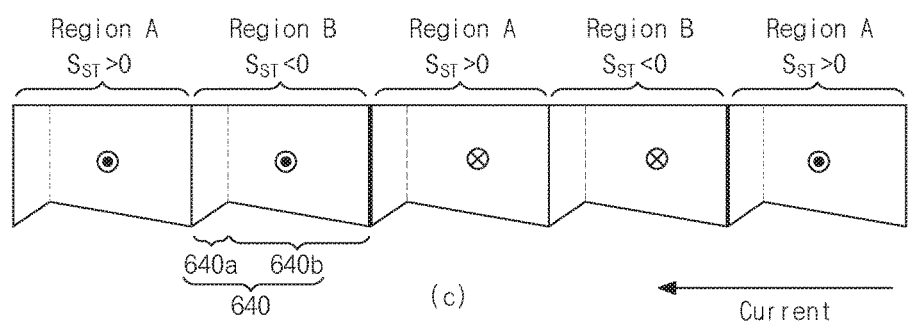

FIG. 10 is a diagram schematically illustrating a MDW motion device according to even further example embodiments of the inventive concept. FIG. 11 is a plan view illustrating an operation of the MDW motion device of FIG. 10. For the sake of brevity, the elements and features of this example that are similar to those previously shown and described with reference to FIG. 9 will not be described in much further detail.

Referring to FIGS. 9, 10, and 11, an MDW motion device 600 may include a nanowire 610. The nanowire 610 may include a ferromagnetic layer 612, which is provided on a substrate and has perpendicular magnetic anisotropy, and a non-magnetic metal layer 614, which extends parallel to and in contact with the ferromagnetic layer 612. The non-magnetic metal layer 614 may include first non-magnetic regions A, which are arranged in an extension direction of the non-magnetic metal layer 614, and second non-magnetic regions B, each of which is provided between each adjacent pair of the first non-magnetic regions A. Two portions of the ferromagnetic layer 512 corresponding to the first and second non-magnetic regions A and B may have spin torque coefficients of opposite signs. In the case where an MDW is positioned at the interface AB between two portions of the ferromagnetic layer corresponding to the first and second non-magnetic regions A and B, the MDW may be moved by an in-plane current flowing through the non-magnetic metal layer.

The non-magnetic metal layer 614 may include a lower non-magnetic metal layer 614a under the ferromagnetic layer 612 and an upper non-magnetic metal layer 614b on the ferromagnetic layer 612. The lower non-magnetic metal layer 614a or the upper non-magnetic metal layer 614b may be formed of or include at least one of platinum (Pt), palladium (Pd), tantalum (Ta), titanium (Ti), tungsten (W), or gold (Au). The lower non-magnetic metal layer 614a or the upper non-magnetic metal layer 614b may be provided in the form of a thin film whose thickness ranges from several angstroms to several nanometers.

A thickness of the upper non-magnetic metal layer 614b in the first non-magnetic region A may be different from that in the second non-magnetic region B. In certain embodiments, a thickness of the lower non-magnetic metal layer 614a in the first non-magnetic region A may be different from that in the second non-magnetic region B.

Notches 640 may be periodically formed along an extension direction of the nanowire 610 or the MDW motion device 600, and this may make it possible to move an MDW, which escapes from the interface AB, in the same direction at all times. Each of the notches 640 may be used as a structure for selecting a direction of motion of the MDW. For example, the notch 640 may be formed to span a unit length of each of the first and second ferromagnetic regions A and B. In the case where the unit lengths of the first and second ferromagnetic regions A and B are equal to each other, the notches 640 may be repeatedly formed along the extension direction of the nanowire 610.

The notch 640 may be realized by locally minimizing a width of a nanowire, which is provided in the form of a strip line, and in some embodiments, the notch 640 may be provided to minimize the energy of the MDW. In the case where a current flowing through the non-magnetic metal layer is used to pin the MDW to the interface AB and then the current is removed, the MDW may be spontaneously moved to a narrowest portion of the notch, without the use of external energy. Thus, the MDW may be positioned at the narrowest portion of the notch, even in a state of no external current. In the case where the MDW is positioned at the second non-magnetic region B which is selected when there is no external current, the MDW may be moved in a positive length direction by a negative external current. Also, in the case where the MDW is positioned at the first non-magnetic region A which is selected when there is no external current, the MDW may be moved in a positive length direction by a positive external current. Such a unidirectional motion may be exploited to realize a magnetic racetrack memory device and a shift register logic device.

The notch 640 may be provided to have a smallest width near the interface AB between the first and second ferromagnetic regions A and B. The notch 640 may be provided in such a way that its narrowest portion is not aligned to the interface AB. The notch 640 may include a first notch region 640a with a rapidly decreasing width and a second notch region 640b with a gently increasing width. The notch 640 may have a unit length corresponding to that of the first or second non-magnetic region A or B, a start position of the first notch region 640a may be aligned to the interface AB. An end position of the second notch region 640b may be aligned to another interface AB that is spaced apart from the start position of the first notch region 640a by the unit length of the notch 640. This structure of the notch may contribute to lower an energy barrier which results from the notch, when the MDW is moved in the positive length direction.

In certain embodiments, the notch may be variously modified. An impurity region, in which ions are injected to select a direction of motion of the MDW, may be periodically formed in the ferromagnetic layer.

According to some embodiments of the inventive concept, a method of controlling a position of a magnetic domain wall (MDW) in a MDW-based memory device is provided as a key technology for developing a memory device.

According to some embodiments of the inventive concept, a method of controlling a position of a MDW in a MDW-based logic device is provided as a key technology for developing a logic device.

According to some embodiments of the inventive concept, by locally modulating a constitution and a structure in a specific shape, it is possible to produce a specific shape of a magnetic domain wall, and this may be used as a MDW-based measurement technique such as Dzyaloshinskii-Moriya interaction (DMI) measurement.

While example embodiments of the inventive concepts have been particularly shown and described, it will be understood by one of ordinary skill in the art that variations in form and detail may be made therein without departing from the spirit and scope of the attached claims.

The invention claimed is:

1. A magnetic domain wall (MDW) motion device, comprising:
    a ferromagnetic layer with perpendicular magnetic anisotropy; and
    a non-magnetic metal layer extending parallel to and in contact with the ferromagnetic layer,
    wherein the ferromagnetic layer comprises first ferromagnetic regions, which are arranged in an extension direction of the ferromagnetic layer, and second ferromagnetic regions, which are provided between an adjacent pair of the first ferromagnetic regions,
    wherein the first and second ferromagnetic regions have spin torque coefficients of opposite signs,
    wherein an MDW positioned at an interface between the first and second ferromagnetic regions is moved by an in-plane current flowing through the non-magnetic metal layer,
    wherein each of the first and second ferromagnetic regions comprises a notch that is provided at the interface between the first and second ferromagnetic regions in contact with each other and has a reduced width, and
    wherein a narrowest portion of the notch is not aligned to the interface between the first and second ferromagnetic regions.

2. The MDW motion device of claim 1, wherein the spin torque coefficients of the first and second ferromagnetic regions are determined by a structure or a constitution of the ferromagnetic layer.

3. The MDW motion device of claim 2, wherein a sign of the spin torque coefficient of one of the first and second ferromagnetic regions is changed through doping of oxygen atoms.

4. The MDW motion device of claim 1, wherein the non-magnetic metal layer comprises:
an upper non-magnetic metal layer provided to be adjacent to a top surface of the ferromagnetic layer; and
a lower non-magnetic metal layer provided to be adjacent to a bottom surface of the ferromagnetic layer.

5. The MDW motion device of claim 1, wherein the notch comprises a first notch region with a rapidly decreasing width and a second notch region with a gently increasing width,
wherein the notch has a unit length corresponding to a length of the first or second ferromagnetic region,
wherein a start position of the first notch region is aligned to the interface between the first and second ferromagnetic regions, and
wherein an end position of the second notch region is aligned to another interface between the first and second ferromagnetic regions and is spaced apart from the start position of the first notch region by the unit length.

6. The MDW motion device of claim 1, wherein the ferromagnetic layer further comprises an auxiliary pinning region provided near the interface between the first and second ferromagnetic regions, and
wherein the auxiliary pinning region is provided in such a way that its center is not aligned to the interface between the first and second ferromagnetic regions.

7. The MDW motion device of claim 6, wherein the auxiliary pinning region comprises an impurity injected in the ferromagnetic layer, and
wherein the impurity comprises at least one of oxygen, fluorine, nitrogen, metal, transition metals, or gallium.

8. A magnetic domain wall (MDW) motion device, comprising:
a ferromagnetic layer with perpendicular magnetic anisotropy; and
a non-magnetic metal layer extending parallel to and in contact with the ferromagnetic layer, the non-magnetic metal layer comprising:
an upper non-magnetic metal layer provided to be adjacent to a top surface of the ferromagnetic layer; and
a lower non-magnetic metal layer provided to be adjacent to a bottom surface of the ferromagnetic layer,
wherein a thickness of the upper non-magnetic metal layer in the first non-magnetic region is different from that in the second non-magnetic region, and
wherein a thickness of the lower non-magnetic metal layer in the first non-magnetic region is different from that in the second non-magnetic region,
wherein the non-magnetic metal layer comprises first non-magnetic regions, which are arranged in an extension direction of the non-magnetic metal layer, and second non-magnetic regions, which are provided between an adjacent pair of the first non-magnetic regions,
wherein two portions of the ferromagnetic layer corresponding to the first and the second non-magnetic regions have spin torque coefficients of opposite signs, and
wherein an MDW positioned at an interface between the two portions of the ferromagnetic layer corresponding to the first and the second non-magnetic regions is moved by an in-plane current flowing through the non-magnetic metal layer.

9. The MDW motion device of claim 8, wherein the ferromagnetic layer further comprises an auxiliary pinning region provided near the interface between the first and second non-magnetic regions, and
wherein the auxiliary pinning region is provided in such a way that its center is not aligned to the interface between the first and second non-magnetic regions.

10. The MDW motion device of claim 9, wherein the auxiliary pinning region comprises an impurity injected in the ferromagnetic layer, and
wherein the impurity comprises at least one of oxygen, fluorine, nitrogen, metal, transition metals, or gallium.

11. A magnetic domain wall (MDW) motion device, comprising:
a ferromagnetic layer with perpendicular magnetic anisotropy; and
a non-magnetic metal layer extending parallel to and in contact with the ferromagnetic layer,
wherein the non-magnetic metal layer comprises first non-magnetic regions, which are arranged in an extension direction of the non-magnetic metal layer, and second non-magnetic regions, which are provided between an adjacent pair of the first non-magnetic regions,
wherein two portions of the ferromagnetic layer corresponding to the first and the second non-magnetic regions have spin torque coefficients of opposite signs,
wherein an MDW positioned at an interface between the two portions of the ferromagnetic layer corresponding to the first and the second non-magnetic regions is moved by an in-plane current flowing through the non-magnetic metal layer, and
wherein a thickness of the non-magnetic metal layer in the first non-magnetic region is different from that in the second non-magnetic region.

12. The MDW motion device of claim 11, wherein the ferromagnetic layer comprises a notch whose width is locally reduced for each of the first and second non-magnetic regions, and
wherein a narrowest portion of the notch is not aligned to the interface between the first and second non-magnetic regions.

13. The MDW motion device of claim 12, wherein the notch comprises a first notch region with a rapidly decreasing width and a second notch region with a gently increasing width,
wherein the notch has a unit length corresponding to a length of the first or second non-magnetic region,
wherein a start position of the first notch region is aligned to the interface between the first and second non-magnetic regions, and
wherein an end position of the second notch region is aligned to another interface between the first and second non-magnetic regions and is spaced apart from the start position of the first notch region by the unit length.

14. A nanowire, comprising:
a ferromagnetic layer with perpendicular magnetic anisotropy;
a non-magnetic metal layer extending parallel to and in contact with the ferromagnetic layer,
first and second regions which are alternately arranged in an extension direction of the nanowire,
wherein the first and second regions have spin torque coefficients of opposite signs, and wherein an MDW of the ferromagnetic layer at an interface between the first and second regions is adapted to be moved by an in-plane current flowing through the non-magnetic metal layer; and a motion direction selection unit configured to select a direction of motion of the MDW in a state in which the in-plane current is removed.

15. The nanowire of claim 14, wherein the motion direction selection unit is a notch formed in the ferromagnetic layer, an impurity doped region formed in the ferromagnetic layer, or a magnetic field applying element additionally provided near the nanowire.

16. The nanowire of claim 14, wherein the spin torque coefficient is spatially modulated by locally injecting oxygen impurities into the ferromagnetic layer or by locally modulating a thickness of the non-magnetic metal layer.

17. The nanowire of claim 14, wherein the spin torque coefficient is spatially modulated by modulating an interface between the ferromagnetic layer and the non-magnetic layer.

* * * * *